(12) United States Patent
Shao et al.

(10) Patent No.: US 7,795,074 B2
(45) Date of Patent: Sep. 14, 2010

(54) WLCSP TARGET AND METHOD FOR FORMING THE SAME

(75) Inventors: Mingda Shao, Jiang Su Province (CN); Guoqing Yu, Jiang Su Province (CN); Wei Wang, Jiang Su Province (CN); Hanyu Li, Jiang Su Province (CN); Xiaohua Huang, Jiang Su Province (CN)

(73) Assignee: China Wafer Level CSP Ltd., Jiang Su Province (CN)

( * ) Notice: Subject to any disclaimer, the term of this patent is extended or adjusted under 35 U.S.C. 154(b) by 0 days.

(21) Appl. No.: 12/352,858

(22) Filed: Jan. 13, 2009

(65) Prior Publication Data

US 2010/0044857 A1 Feb. 25, 2010

(30) Foreign Application Priority Data

Aug. 20, 2008 (CN) .................... 2008 1 0041985

(51) Int. Cl.
*H01L 21/44* (2006.01)
*H01L 21/48* (2006.01)
*H01L 21/50* (2006.01)

(52) U.S. Cl. ............... 438/106; 438/113; 438/460; 257/E21.499; 257/E21.505; 257/E21.508; 257/E21.509; 257/E21.511; 257/E21.517

(58) Field of Classification Search ............ 438/106, 438/113, 311, 197, 199, 460, 463, 753; 257/E21.499, 257/505, 508, 509, 511, 517
See application file for complete search history.

(56) References Cited

U.S. PATENT DOCUMENTS

| 6,521,485 B2 * | 2/2003 | Su et al. ............... 438/114 |
| 6,841,872 B1 * | 1/2005 | Ha et al. ............... 257/736 |
| 7,164,208 B2 * | 1/2007 | Kainou et al. ........... 257/780 |
| 7,394,152 B2 * | 7/2008 | Yu et al. ............... 257/690 |
| 2007/0120244 A1 * | 5/2007 | Kojima et al. .......... 257/691 |

FOREIGN PATENT DOCUMENTS

| CN | 101009230 A | 8/2007 |
| CN | 1797728 A | 7/2009 |

OTHER PUBLICATIONS

Chinese Office Action dated May 15, 2009 from corresponding Chinese Application No. CN101122655.

* cited by examiner

*Primary Examiner*—David Nhu
(74) *Attorney, Agent, or Firm*—Wolf, Greenfield & Sacks, P.C.

(57) ABSTRACT

The invention provides a Wafer Level Chip Size Packaging (WLCSP) target and a method for forming it. A WLCSP target is formed by recombining single chips, wafer parts each including two or more chips or half finished packaging targets which have been subjected to at least one previous step of packaging onto a first substrate, or bonding a wafer part which is formed by dicing a whole wafer and includes at least two chips to a second substrate for bonding. Thus, a wafer with a larger size can be packaged through the WLCSP on a WLCSP apparatus with a smaller size while benefiting from the advantages of the WLCSP, the WLCSP apparatus remains applicable within a longer period of time, the cost is lowered, and enterprises may keep up with the development of the market and the increase of the wafer size without having to update the WLCSP apparatus substantially.

26 Claims, 6 Drawing Sheets

```
┌─────────────────────────────────┐
│ at least two recombination units and │
│ a first substrate are provided, the  │
│ recombination unit including a       │──── S701
│ single chip, a wafer part including  │
│ at least two chips and a half        │
│ finished packaging target which has  │
│ been subjected to at least one       │
│ previous step of packaging           │
└─────────────────────────────────┘
                  │
┌─────────────────────────────────┐
│ the side of each of the              │
│ recombination units, which is        │
│ opposite to the side including a     │──── S702
│ circuit, is bonded to the first      │
│ substrate to form a WLCSP target     │
└─────────────────────────────────┘
```

WLCSP TARGET AND METHOD FOR FORMING THE SAME

CROSS REFERENCE TO RELATED APPLICATIONS

This application claims the priority benefit of Chinese patent application 2008-10041985.7, filed on Aug. 25, 2008.

FIELD OF THE INVENTION

The present invention relates to a Wafer Level Chip Size Packaging (WLCSP) target and a method for forming the same.

BACKGROUND OF THE INVENTION

The WLCSP technology is a technology in which a whole wafer is packaged and tested first, and then diced into individual chips. Such a technology is totally different from conventional packaging technologies such as Chip on Board (COB), where a whole wafer is thinned and diced into individual chips, and then the chips are wire bonded. The size of a chip after being packaged with the WLCSP technology is the same as that of the bare chip. The WLCSP technology satisfies the requirements for the microelectronic products, such as light weight, small size (especially in length and thickness) and low cost. A chip packaged with the WLCSP technology realizes its miniaturization, and the chip cost decreases significantly with the decrease of the chip size and the increase of the wafer size. The WLCSP technology, which, when being implemented, can take into account the IC design, wafer fabrication, packaging test and substrate fabrication in combination, is a focus in the packaging field and one of the development trends of the packaging technologies.

With the increase of the chip size, the machine station and other parts of the WLCSP apparatus need to be enlarged correspondingly or the whole WLCSP apparatus needs to be replaced with a new one. Thus, the cost for updating the WLCSP apparatus increases significantly.

In addition, a crack often occurs during the wafer fabrication. If a wafer with a crack is packaged with the conventional WLCSP technology, the crack may be prolonged.

SUMMARY OF THE INVENTION

The present invention is intended to realize the WLCSP for chips, wafers, wafer parts or half finished packaging targets with different sizes on a WLCSP apparatus with an individual size, so that the WLCSP apparatus remains applicable within a longer period of time and the cost of hardware update decreases.

For achieving this object, we need to focus on two aspects. The first aspect is how to recombine chips, wafer parts or half finished packaging targets each having a smaller size into a WLCSP target having a larger size.

With respect to the first aspect, the present invention provides a method for forming a WLCSP target, including: providing at least two recombination units and a first substrate; and bonding a side of each of the recombination units, which is opposite to a side including a circuit, to the first substrate to form a WLCSP target.

Optionally, the recombination units includes a single chip, a wafer part including at least two chips, or a half finished packaging target which has been subjected to at least one previous step of packaging.

The second aspect is how to package a wafer having a larger size with the WLCSP on a WLCSP apparatus having a smaller size.

With respect to the second aspect, the present invention provides another method for forming a WLCSP target, including: providing a wafer part, which is formed through wafer dicing or cracking and includes at least two chips, and a second substrate for bonding; and bonding a side of the wafer part on which a circuit is formed to the second substrate for bonding to form a WLCSP target.

According to the present invention, a WLCSP target is formed by recombining single chips, wafer parts each including two or more chips or half finished packaging targets which have been subjected to at least one previous step of packaging onto a first substrate, or bonding a wafer part which is formed by dicing a whole wafer and includes at least two chips to a second substrate for bonding. Compared with the prior art, a wafer with a larger size can be packaged through the WLCSP on a WLCSP apparatus with a smaller size while benefiting from the advantages of the WLCSP. Thus, the WLCSP apparatus remains applicable within a longer period of time and the cost is lowered. Therefore, enterprises may keep up with the development of the market and the increase of the wafer size without having to update the WLCSP apparatus substantially.

The above descriptions are illustrated as examples and should not be used to limit the scope of the present invention.

DETAILED DESCRIPTION OF THE EMBODIMENTS

Embodiments of the present invention provide a method for forming a WLCSP target so as to package chips, wafers, wafer parts or half finished packaging targets with different sizes through the WLCSP on a machine station with an individual size.

The detailed description will be given below with reference to the Drawings.

Figure 1:
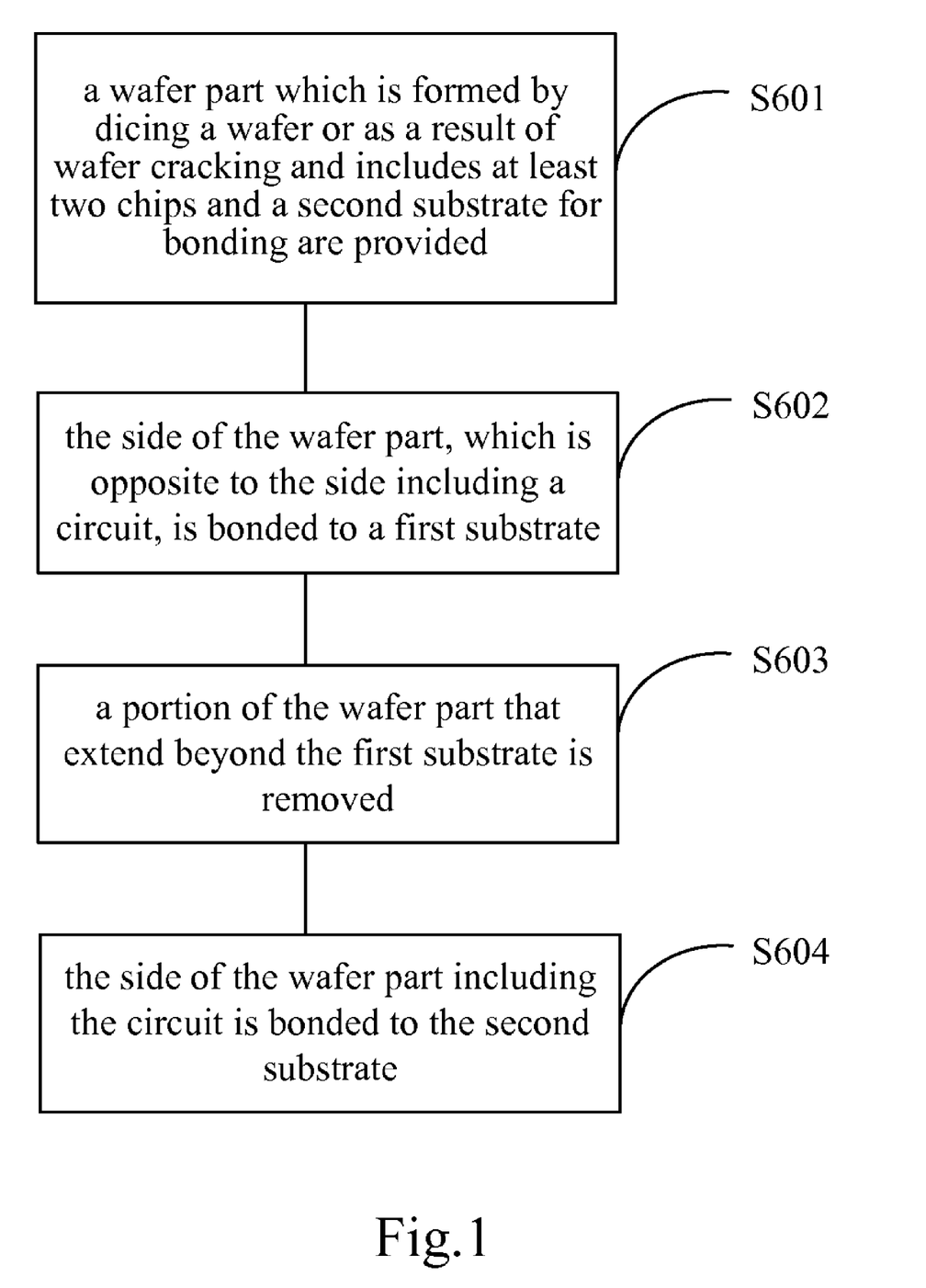
FIG. 1 is a flow chart showing a method for forming a WLCSP target according to one embodiment of the present invention.

As shown in FIG. 1, with respect to an aspect of the present invention, that is, how to package a wafer with a larger size through the WLCSP on a WLCSP apparatus with a smaller size, one embodiment of the present invention provides a method for forming a WLCSP target, including the following steps.

At S601, a wafer part formed by dicing a whole wafer or as a result of wafer cracking, and a second substrate for bonding, are provided. The wafer part includes at least two chips.

At S602, the side of the wafer part, which is opposite to the side including a circuit, is bonded to a first substrate.

At S603, a portion of the wafer part that extends beyond the first substrate is removed.

At S604, the side of the wafer part including the circuit is bonded to the second substrate.

Figure 2:
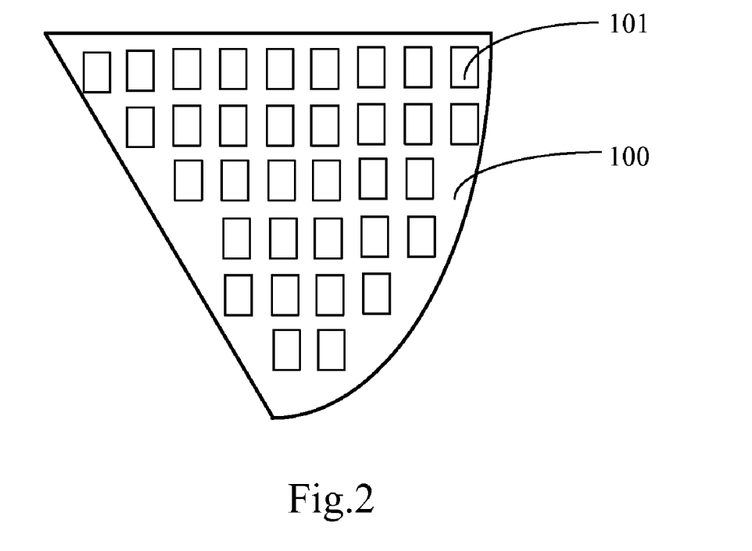
FIG. 2 is a diagram showing a wafer part used in a method for forming a WLCSP target according to another embodiment of the present invention.
Figure 3:
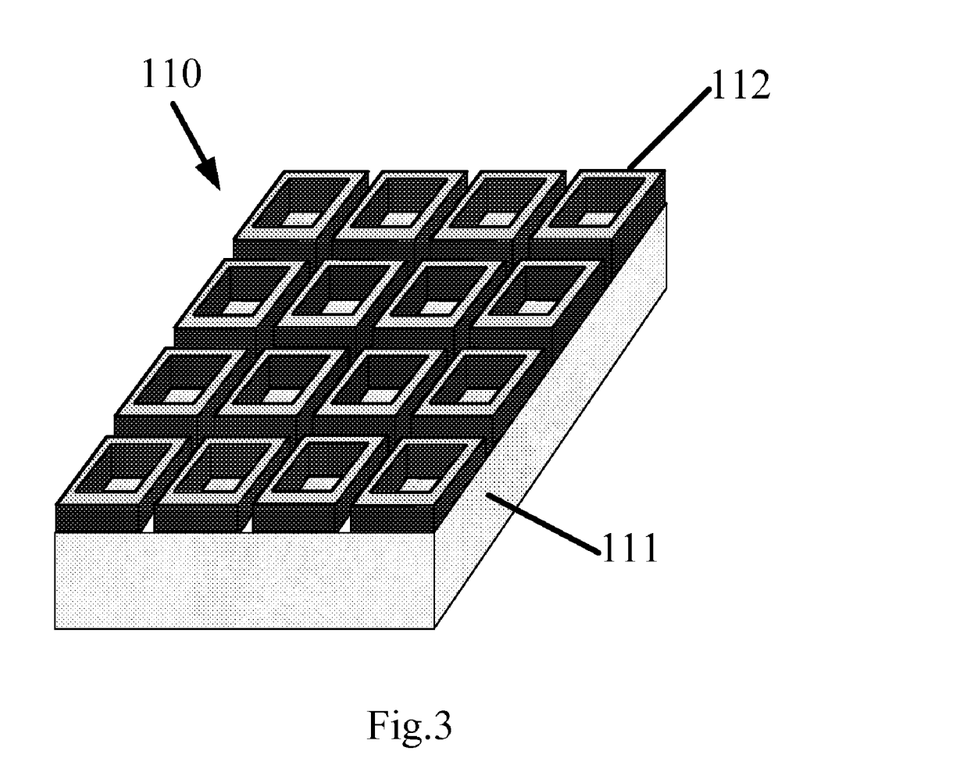
FIG. 3 is a structure diagram showing a second substrate used in a method for forming a WLCSP target according to another embodiment of the present invention.

At S601, the wafer part 100 as shown in FIG. 2 and the second substrate for bonding 110 as shown in FIG. 3 are provided. The WLCSP is different from the conventional packaging technologies in which a single chip is packaged. The advantage of the WLCSP lies in that multiple chips are packaged on a wafer scale so as to improve the efficiency and lower the cost. Thus, the wafer part 100 includes at least two chips 101.

The wafer part 100 may be formed by dicing a whole wafer or as a result of cracking of a whole wafer, and may have a regular or irregular shape. The method for dicing the wafer is known to those skilled in the art and descriptions thereof are omitted here.

As mentioned above, a crack often occurs during the wafer fabrication. If the WLCSP is performed to a wafer with a crack, the crack may be prolonged. In order to address this problem, the wafer may be diced with reference to the crack so as to remove a portion of the wafer with the crack and keep the wafer part 100 without the crack. Hence, the wafer part with the crack is removed through dicing and the WLCSP is performed to the wafer part without the crack. In this way, the yield of the chip fabrication is improved.

The second substrate for bonding 110 provided in step S601 includes a third substrate 111 and cavity walls 112 as shown in FIG. 3. The third substrate 111 may be in a circular shape matching the shape of the machine station of the WLCSP apparatus. The third substrate 111 may be made of glass so that the third substrate 111 is flat and transparent. It is understood by those skilled in the art that the third substrate 111 may also be made of another material, such as silicon. On one side of the third substrate 111, multiple ring-like cavity walls 112 may be provided. The shape of the area enclosed by the cavity walls 112, which is slightly larger than the area of the chip 101, is similar to that of the chip 101. The arrangement of and the spacing between the cavity walls 112 on the third substrate 111 correspond to those for the chips 101 on the wafer part 100. Thus, in the subsequent process of bonding the wafer part 100 to the second substrate 110, the chips 101 on the wafer part 100 may be accommodated respectively in the cavities formed by the cavity walls 112.

In order to improve the efficiency of the WLCSP and lower the cost, the size of the second substrate 110 should not be too small. Preferably, the diameter of the circumcircle of the second substrate 110 is equal to or larger than 100 mm, that is, the diameter of the circular third substrate 111 on the second substrate 110 is at least 4 inches.

According to the conventional WLCSP technology, each chip on the wafer part is subsequently subjected to wafer level cutting or plasma etching so as to form a sloping side wall to be deposited with a conductive metal layer. Because the side wall is formed to be sloping, if the wafer part 100 is thick, the area of a side of the cut wafer part on which bumps are to be formed will be too small, that is, the space for accommodating the bumps will be too small. In order to avoid this problem, the wafer part 100 is further thinned. The thinning process is known to those skilled in the art and descriptions thereof are omitted here. The thinning process may be performed immediately after step S601 or at any step as described below in conjunction with a specific embodiment.

Figure 4:
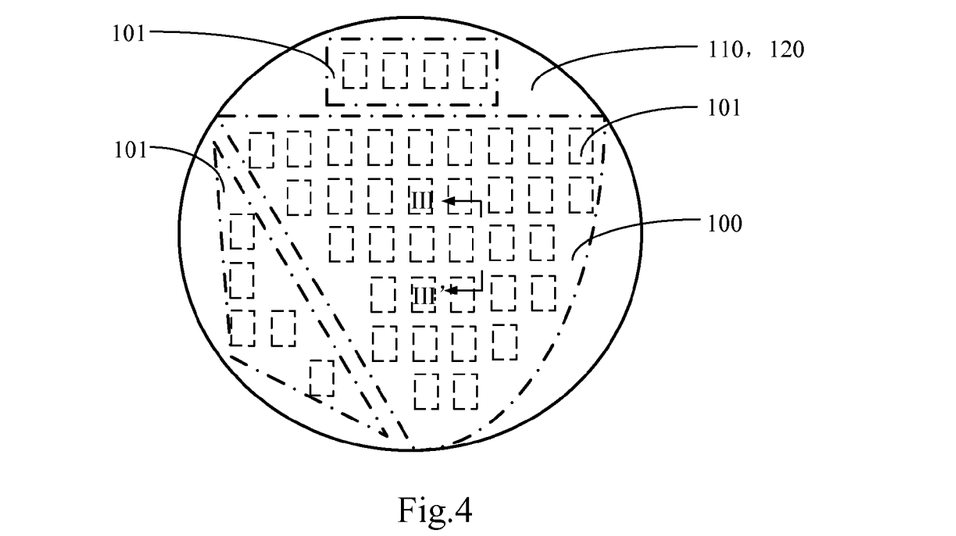
FIG. 4 is a structure diagram showing a WLCSP target used in a method for forming a WLCSP target according to another embodiment of the present invention.

In order to increase the production efficiency of the WLCSP and lower the packaging cost, multiple wafer parts 100 may be arranged to occupy the second substrate 110 as far as possible, as shown in FIG. 4. Then, the multiple wafer parts 100 are bonded to the second substrate 110 in a subsequent step.

Figure 5:
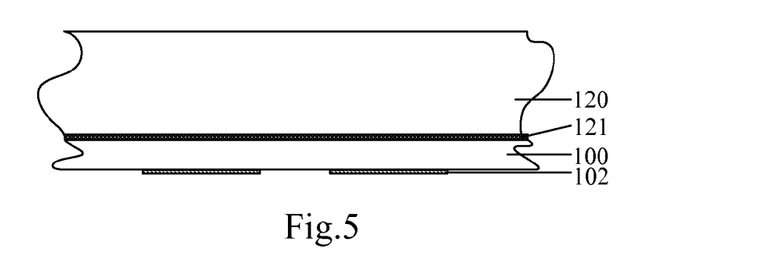
FIG. 5 is a diagram showing a structure obtained by bonding a wafer part to a first substrate in a method for forming a WLCSP target according to another embodiment of the present invention.

To combine multiple wafer parts 100 together according to an embodiment, or provide a support for the wafer part 100 and facilitate the bonding between the wafer part 100 and the second substrate 110 in the subsequent steps, step S602 may be performed. As shown in FIG. 5, the side of the wafer part 100 opposite to the side on which a circuit 102 is formed is bonded to a first substrate 120 through a first adhesive layer 121. The first substrate 120 may be in a circular shape so as to match the second substrate 110 in the subsequent processes. The first substrate 120 may be a silicon first substrate. Because of the high heat dissipation capability of the silicon first substrate, the requirement for heat dissipation during the process of packaging or during the process of application of the chips after packaging can be satisfied. The first substrate 120 may also be made of another material which can provide a support for the wafer part 100 and exhibits a certain level of transparency, such as glass. Optionally, the first substrate 120 may also be made of another material which can provide the support.

According to another embodiment, a step for further dicing the wafer part 100 needs to be performed so as to meet the requirement for the recombination.

Then, step S603 is performed. The portion of the wafer part 100 which extends beyond the first substrate 120 is removed. The profile of the wafer part 100 or the multiple wafer parts 100 after the recombination may go beyond the profile of the first substrate 120, which is disadvantageous for the subsequent packaging operations. Thus, the step for removing the portion of the wafer part 100 or the multiple wafer parts 100 which extends beyond the profile of the first substrate 120 may be performed.

Figure 6:
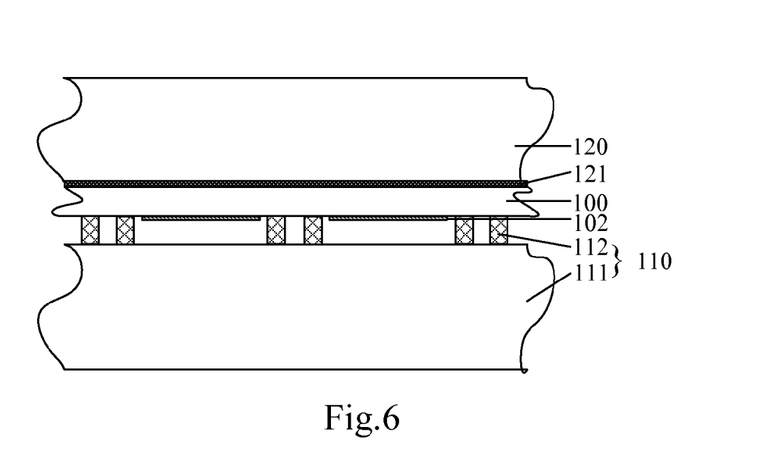
FIG. 6 is a section diagram taken along a line III-III' in FIG. 4.

Then, step S604 may be performed, where the side of the wafer part 100 on which the circuit 102 is formed is bonded to the second substrate 110, and the structure as shown in FIG. 6 is formed. The second adhesive for bonding the wafer part 100 to the second substrate 110 includes epoxy resin, polyimide, BCB resin and BT resin. The second adhesive is used for the bonding as well as insulation and sealing. When the bonding is performed, the chips 101 on the wafer part 100 are accommodated respectively in the cavities formed by the cavity walls 112 on the base 110. Thus, a structure for sealing the circuits 102 on the chips 101 is formed by the wafer part 100 and the second substrate 110 in combination.

Depending on different requirements for packaging the chips, sometimes the first substrate 120 needs to be removed. In other words, a step for removing the first substrate 120 needs to be performed after step S604. If the first substrate 120 needs to be removed in the subsequent processes, the adhesive layer 121 for bonding the wafer part 100 to the first substrate 120 is formed by an adhesive whose adhesion can be reduced or eliminated, such as a UV adhesive and a wax adhesive. The adhesion of the UV adhesive may be reduced significantly or eliminated after being exposed to UV light. The adhesion of the wax adhesive may also be reduced significantly after being heated to a predetermined temperature.

According to different requirements for the packaging, the step for thinning the wafer part 100 may be performed after the first substrate 120 is removed.

According to the present invention, the chip 101 is used in a broad concept and includes an integrated circuit chip such as a processor, a memory and a controller, an optical sensor chip such as a CCD and a CMOS image sensor, another sensor chip such as a heat sensor chip and a motion sensor chip, and a Micro Electro-Mechanical System (MEMS) chip. In other words, the circuit 102 in the chip 101 may include an optical sensor, a heat sensor, a motion sensor or an MEMS chip.

Figure 7:
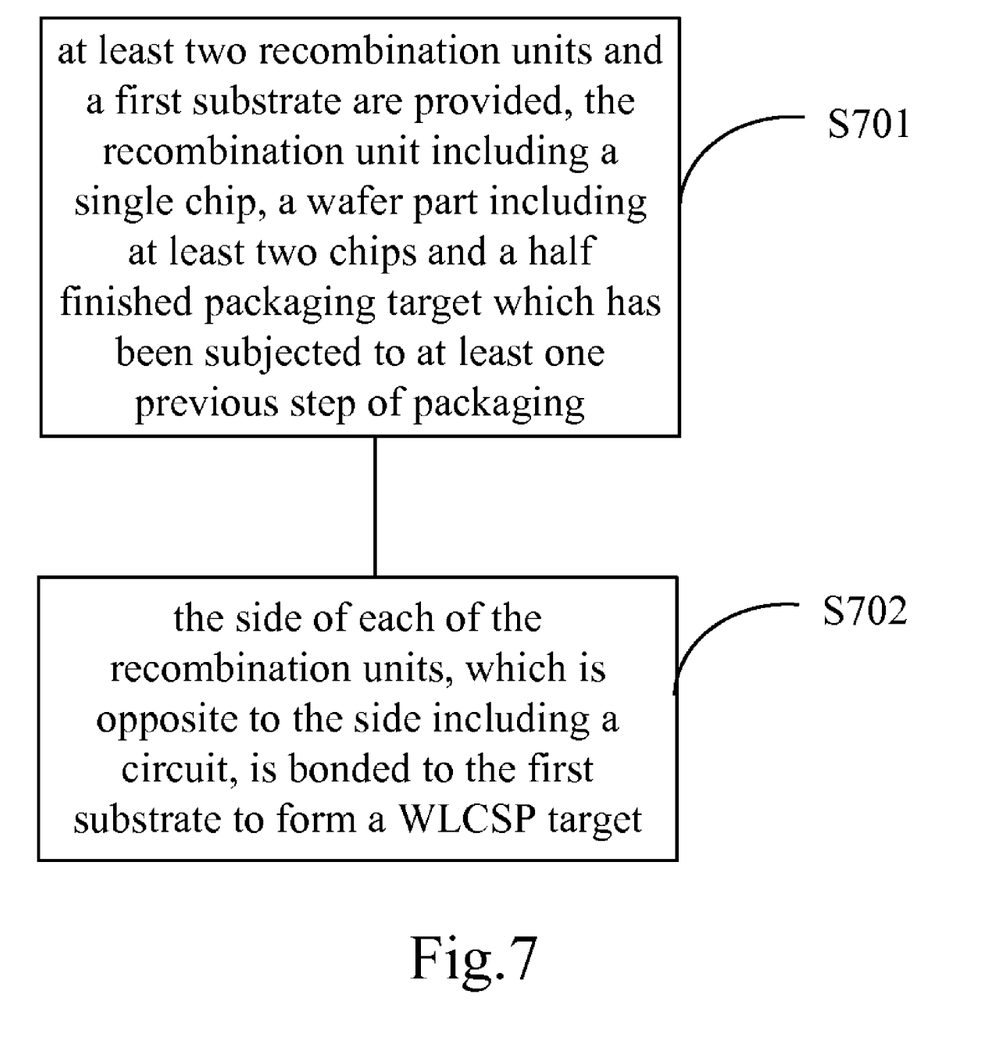
FIG. 7 is a flow chart showing a method for forming a WLCSP target according to another embodiment of the present invention.

With respect to another aspect of the present invention, i.e. how to recombine chips, wafer parts or half finished packaging targets each having a smaller size into a WLCSP target having a larger size, one embodiment of the present invention provides a method for forming a WLCSP target as shown in FIG. 7, including the following steps.

At step S701, at least two recombination units and a first substrate are provided. The recombination units includes a single chip, a wafer part including at least two chips and a half finished packaging target which has been subjected to at least one previous step of packaging.

At step 702, the side of each of the recombination units, which is opposite to the side including a circuit, is bonded to the first substrate to form a WLCSP target.

According to one embodiment of the present invention, the step for forming a half finished packaging target in step S701 at least includes: bonding a wafer to a second substrate to form a two-layer structure; and dicing the two layer structure into half finished packaging targets. The structure and material of the second substrate to be bonded to the wafer are similar to those described in conjunction with step S601. In the step for dicing the two-layer structure, the two-layer structure may be diced into half finished packaging targets each including one or more chips.

The method for forming the half finished packaging targets is not so limited. Those skilled in the art can appreciate that, the half finished packaging target formed at any step during the packaging may be used as a recombination unit, no matter whether the half finished target has been diced or not, how many chips are included in the half finished packaging target and how large the half finished packaging target is.

Then, step S702 is performed, where the side of each of the recombination units, which is opposite to the side including the circuit, is bonded to the first substrate to form a WLCSP target. Those skilled in the art can appreciate that, during the WLCSP, performance of the subsequent steps may be facilitated in the case that the chips are arranged in array. Thus, at Step S702, the recombination units may be arranged in array on the first substrate. After step S702, the chips are recombined to cover substantially the whole wafer. Hence, the focus of this embodiment is how to perform the WLCSP to at least two chips formed by dicing the wafer.

In the case that each of the recombination units is a single chip, a wafer part including at least two chips or a half finished packaging target which has not been bonded to the second substrate, the method further includes the following step after step S702: bonding the recombination units to the second substrate. The performance of this step and the structure and material for it are similar to those described in conjunction with step S601 and descriptions thereof are omitted here.

In steps S701-S702, for the details of the forming of the wafer part, the type of the chip, the size of the first substrate, the adhesive and other steps such as the step of removing the first substrate and the step of thinning, reference may be made to those described in conjunction with steps S601-S604.

Those skilled in the art can appreciate that, the technical solution including a step of dicing the wafer into multiple chips before step S701 may also be used to deal with one of the aspects of the present invention, i.e. how to package a wafer with a larger size on a WLCSP apparatus with a smaller size.

As shown in FIGS. 8-14, the method for packaging the WLCSP target formed according to one embodiment of the present invention includes the following steps.

Figure 8:
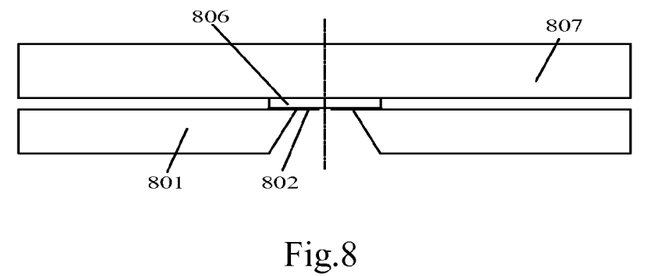
FIG. 8-14 are diagrams showing a WLCSP target.

As shown in FIG. 8, the side of each of chips 801 in the WLCSP target, which is opposite to the side including a circuit, is cut, so that a side wall inclining to the side including the circuit is formed on each of the chips 801 and a chip pad 802 is exposed.

Figure 9:
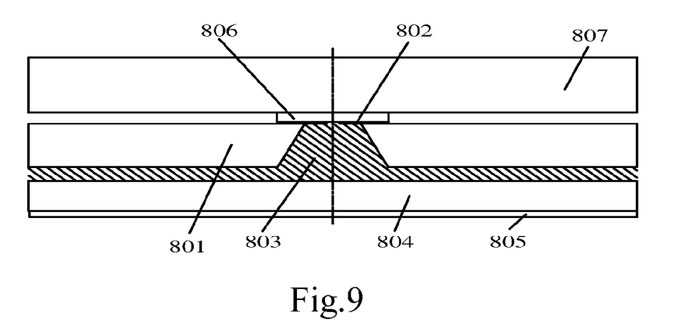

As shown in FIG. 9, an insulation layer 803 is coated over one side of the chips 801 in the WLCSP target until the chips 801 are covered.

A support layer 804 and a solder block layer 805 are formed over the insulation layer.

Figure 10:
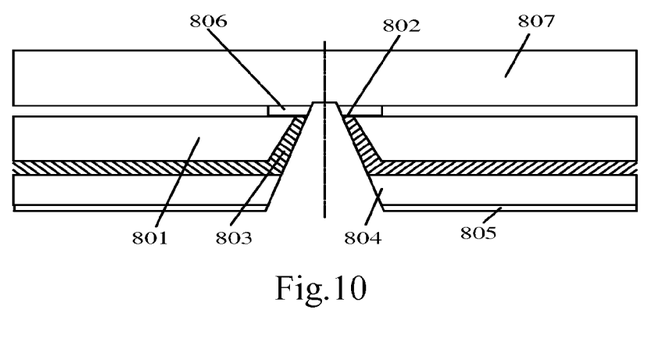

As shown in FIG. 10, the support layer 804, the insulation layer 803, the pads 802 and cavity walls 806 are etched at the boundary between the chips 801 until the third substrate 807 is exposed to form a trench.

Figure 11:
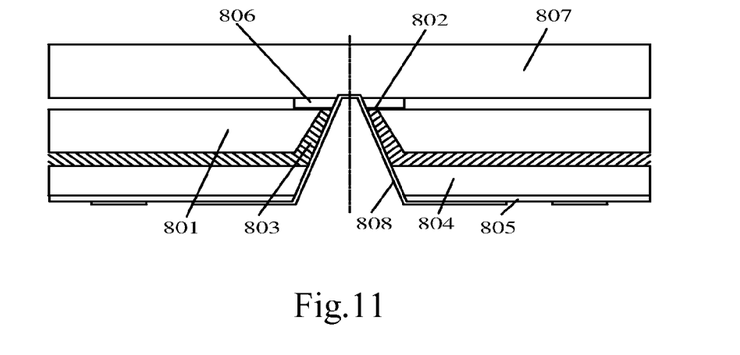

As shown in FIG. 11, an intermediate metal layer 808 is formed over the solder block layer 805 and the trench. The intermediate metal layer 808 is electrically connected with the pads 802.

The intermediate metal layer 808 on the support layer is patterned.

Figure 12:
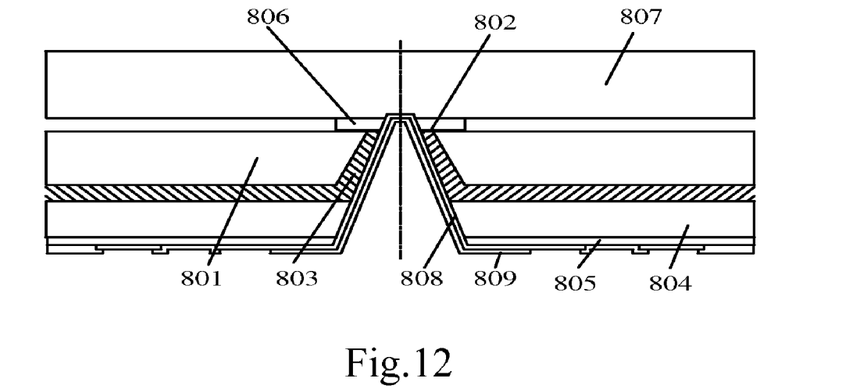

As shown in FIG. 12, a mask layer 809 is formed over the intermediate metal layer 808.

The mask layer 809 is patterned until part of the intermediate metal layer 808 is exposed. Thus, mask via holes are formed.

Figure 13:
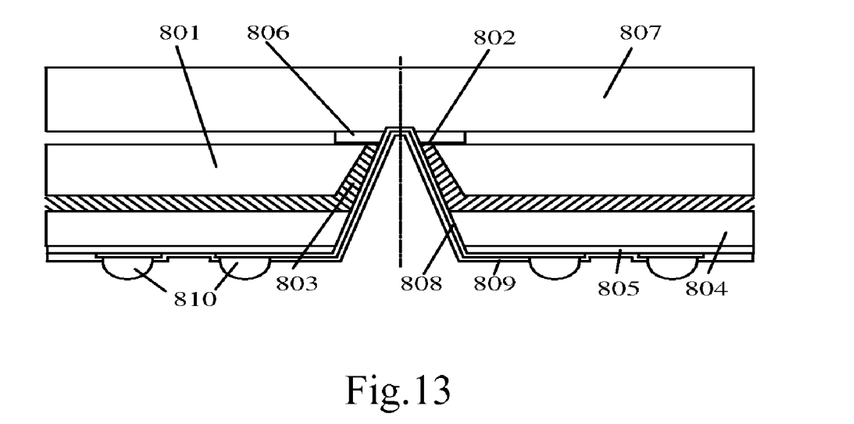

As shown in FIG. 13, metal bumps 810 are formed in the mask via holes.

Figure 14:
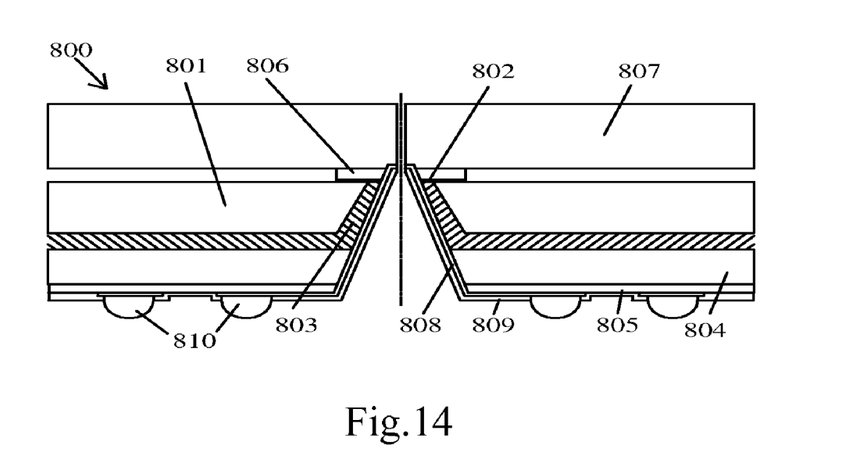

As shown in FIG. 14, the third substrate is diced along the axis of the bottom of the trench and individual complete chip packaging structures are formed.

It should be emphasized that the above-described embodiments, particularly the preferred embodiments, are merely possible examples of the present invention. Many variations and modifications may be made thereto without departing from the spirit and scope of the invention. All such modifications and variations are intended to be included within the scope of this disclosure as defined by the following claims.

What is claimed is:

1. A method for forming a Wafer Level Chip Size Packaging (WLCSP) target, comprising:

providing at least two discrete recombination units and a first substrate; and bonding a side of each of the at least two discrete recombination units, which is opposite to a side including a circuit, to the first substrate to recombine the at least two discrete recombination units so as to form a WLCSP target.

2. The method for forming a WLCSP target according to claim 1, wherein, the at least two discrete recombination units are bonded to the first substrate in array.

3. The method for forming a WLCSP target according to claim 1, further comprising: bonding the at least two discrete recombination units to a second substrate.

4. The method for forming a WLCSP target according to claim 3, further comprising: forming cavity walls corresponding to chips respectively on the second substrate.

5. The method for forming a WLCSP target according to claim 3, further comprising: removing the first substrate.

6. The method for forming a WLCSP target according to claim 5, further comprising: thinning each of the at least two discrete recombination units from the side opposite to the side including the circuit.

7. The method for forming a WLCSP target according to claim 3, wherein, the second substrate is made of a material comprising glass or silicon.

8. The method for forming a WLCSP target according to claim 1, wherein, each of the at least two discrete recombination units comprises one of a single chip, a wafer part comprising at least two chips and a half finished packaging target.

9. The method for forming a WLCSP target according to claim 8, wherein the half finished packaging target is formed through the following steps:
bonding a wafer to the second substrate to form a two-layer structure; and
dicing the two-layer structure into half finished packaging targets.

10. The method for forming a WLCSP target according to claim 8, wherein, the wafer part is formed through wafer dicing or cracking.

11. The method for forming a WLCSP target according to claim 10, further comprising: removing a portion of a wafer comprising a crack by dicing the wafer with reference to the crack so as to keep the wafer part formed through wafer dicing or cracking from the crack.

12. The method for forming a WLCSP target according to claim 8, wherein, a single chip or a wafer part comprising at least two chips is packaged in the half finished packaging target.

13. The method for forming a WLCSP target according to claim 8, wherein, the chip comprises an integrated circuit chip, a sensor chip or a micro electro-mechanical system.

14. The method for forming a WLCSP target according to claim 1, wherein, an adhesive for bonding the at least two discrete recombination units to the first substrate comprises a UV adhesive or a wax adhesive.

15. The method for forming a WLCSP target according to claim 1, wherein, a diameter of a circumcircle of the first substrate is larger than or equal to 100 mm.

16. A method for forming a Wafer Level Chip Size Packaging (WLCSP) target, comprising:
providing at least two discrete wafer parts which are formed through wafer dicing or cracking and each comprises at least two chips and a second substrate for bonding; and
bonding a side of each of the at least two discrete wafer parts on which a circuit is formed to the second substrate for bonding to recombine the at least two discrete wafer parts so as to form a WLCSP target.

17. The method for forming a WLCSP target according to claim 16, further comprising: bonding a side of each of the at least two discrete wafer parts opposite to the side comprising the circuit to a first substrate.

18. The method for forming a WLCSP target according to claim 17, further comprising: removing a portion of the at least two discrete wafer parts which extends beyond the first substrate.

19. The method for forming a WLCSP target according to claim 17, further comprising: removing the first substrate.

20. The method for forming a WLCSP target according to claim 16, further comprising: thinning the at least two discrete wafer parts from the side opposite to the side comprising the circuit.

21. The method for forming a WLCSP target according to claim 19, wherein, an adhesive for bonding the at least two discrete wafer parts to the first substrate comprises a UV adhesive or a wax adhesive.

22. The method for forming a WLCSP target according to claim 16, further comprising: forming cavity walls corresponding to the chips respectively on the second substrate.

23. The method for forming a WLCSP target according to claim 16, wherein, the second substrate is made of a material comprising glass or silicon.

24. The method for forming a WLCSP target according to claim 16, wherein, a diameter of a circumcircle of the second substrate is larger than or equal to 100 mm.

25. The method for forming a WLCSP target according to claim 16, further comprising: removing a portion of a wafer comprising a crack by dicing the wafer with reference to the crack so as to keep each of the at least two discrete wafer parts which are formed through dicing or cracking the wafer comprising the crack from the crack.

26. The method for forming a WLCSP target according to claim 17, wherein, the chips comprises an integrated circuit chip, a sensor chip or a micro electro-mechanical system.

* * * * *

UNITED STATES PATENT AND TRADEMARK OFFICE
CERTIFICATE OF CORRECTION

PATENT NO. : 7,795,074 B2
APPLICATION NO. : 12/352858
DATED : September 14, 2010
INVENTOR(S) : Mingda Shao et al.

It is certified that error appears in the above-identified patent and that said Letters Patent is hereby corrected as shown below:

At column 8, Claim 26, line 43, "claim 17" should read --claim 16--.

Signed and Sealed this

Sixteenth Day of November, 2010

David J. Kappos
*Director of the United States Patent and Trademark Office*